(12) United States Patent
Ge et al.

(10) Patent No.: US 10,338,139 B1
(45) Date of Patent: Jul. 2, 2019

(54) METHOD AND APPARATUS FOR SCAN CHAIN REORDERING AND OPTIMIZATION IN PHYSICAL IMPLEMENTATION OF DIGITAL INTEGRATED CIRCUITS WITH ON-CHIP TEST COMPRESSION

(71) Applicant: Samsung Electronics Co., Ltd., Suwon-si, Gyeonggi-do (KR)

(72) Inventors: Guangyuan Kelvin Ge, Cedar Park, TX (US); Yu-Ming Chiang, Lakeway, TX (US); Rajesh Rajagopalan Kashyap, Austin, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 141 days.

(21) Appl. No.: 15/487,428

(22) Filed: Apr. 13, 2017

Related U.S. Application Data

(60) Provisional application No. 62/435,056, filed on Dec. 15, 2016.

(51) Int. Cl.
  *G01R 31/28* (2006.01)
  *G01R 31/3185* (2006.01)
  (Continued)

(52) U.S. Cl.
  CPC ............... *G01R 31/318541* (2013.01); *G01R 31/318572* (2013.01); *H04L 45/121* (2013.01); *H04L 45/122* (2013.01); *H04L 45/126* (2013.01)

(58) Field of Classification Search
  CPC .... G01R 31/318541; G01R 31/318572; G01R 31/28; H04L 45/121; H04L 45/122; H04L 45/126
  See application file for complete search history.

(56) References Cited

U.S. PATENT DOCUMENTS 5,696,771 A * 12/1997 Beausang ........ G01R 31/31858
  714/726
5,983,376 A * 11/1999 Narayanan ....... G01R 31/31858
  714/726

(Continued)

OTHER PUBLICATIONS

Kapoor, Gourav et al., "Using multi-bit flip-flop custom cells to achieve better SoC design efficiency", Freescale Semiconductor—Aug. 20, 2014, 4 pages.

(Continued)

*Primary Examiner* — Phung M Chung
(74) *Attorney, Agent, or Firm* — Renaissance IP Law Group LLP

(57) ABSTRACT

According to one general aspect, in a large digital integrated circuit with on-chip scan test compression hardware, an apparatus may include a digital circuit receiver circuit and a scan chain reorder circuit. The digital circuit receiver circuit configured to: receive a circuit model file that includes logic circuits that are represented by respective cells, wherein a plurality of cells are arranged in an ordered scan chain, and insert, in to the circuit model file, a dummy cell as an end cell at an end of the ordered scan chain. The scan chain reorder circuit configured to reorder the ordered scan chain to a reordered scan chain based, wherein the scan-chain reorder circuit is configured to maintain a start cell and an end cell of the ordered scan chain as a start cell and an end cell of the reordered scan chain.

20 Claims, 14 Drawing Sheets

(51) Int. Cl.
  *H04L 12/727*    (2013.01)
  *H04L 12/733*    (2013.01)

(56) References Cited

U.S. PATENT DOCUMENTS

| | | | |
|---|---|---|---|
| 6,564,362 B2 * | 5/2003 | Osaki | G01R 31/31853 |
| | | | 257/E27.105 |
| 6,877,120 B2 | 4/2005 | Yoshimoto | |
| 6,954,887 B2 * | 10/2005 | Wang | G01R 31/31704 |
| | | | 714/729 |
| 7,919,981 B2 | 4/2011 | Irie | |
| 7,937,677 B2 * | 5/2011 | Chien | G06F 17/505 |
| | | | 716/103 |
| 8,443,326 B1 | 5/2013 | Gupta et al. | |
| 8,793,546 B2 | 7/2014 | Tekumalla et al. | |
| 8,839,061 B2 * | 9/2014 | Dodeja | G01R 31/31858 |
| | | | 714/727 |
| 9,110,139 B2 | 8/2015 | Wang et al. | |
| 2008/0195904 A1 | 8/2008 | Wang | |

OTHER PUBLICATIONS

Wikipedia, "Multi-level cell", Retrieved from "https://en.wikipedia.org/w/index.php?title=Multi-level_cell&oldid=747690168", Nov. 3, 2016, 3 pages.

\* cited by examiner

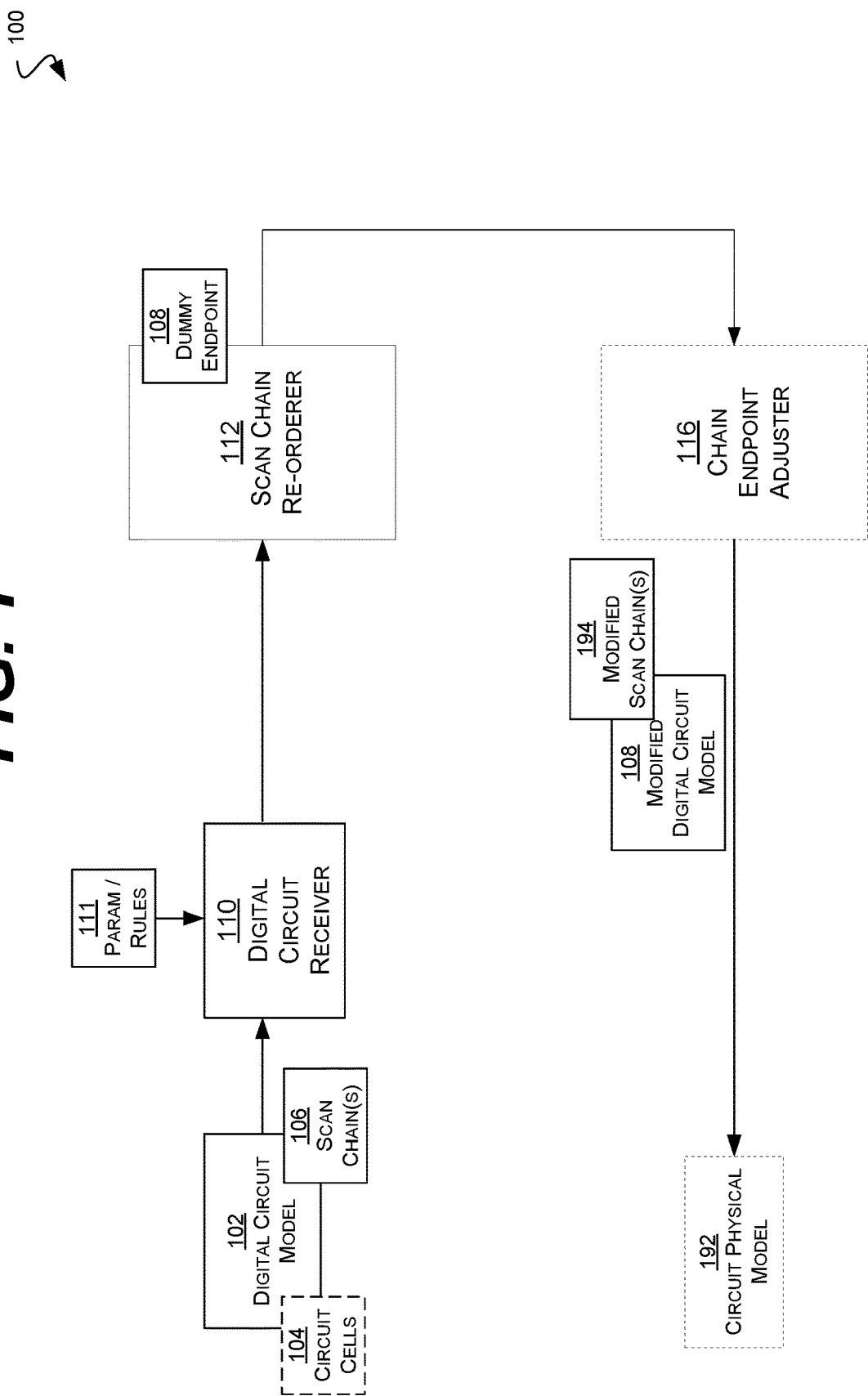

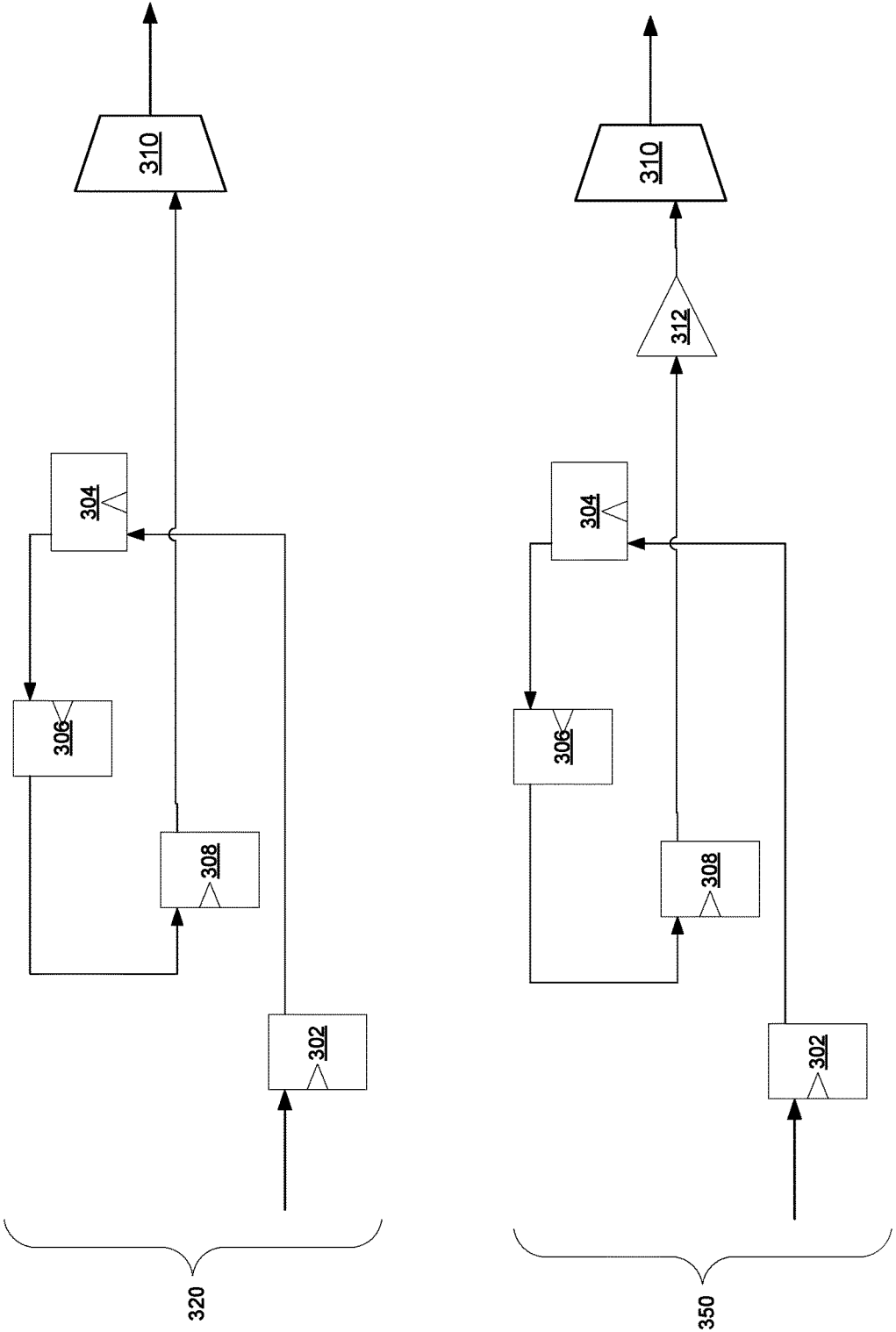

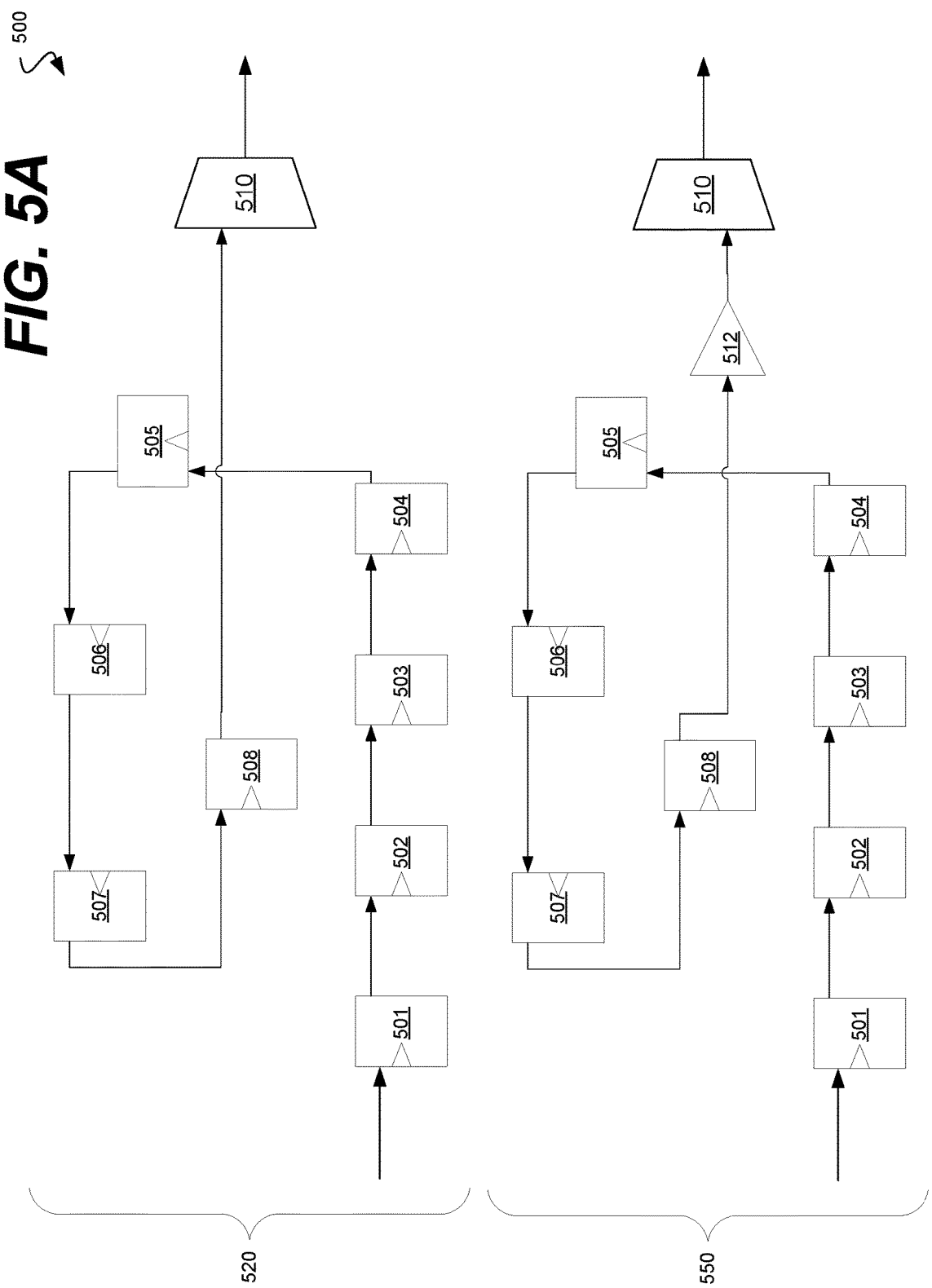

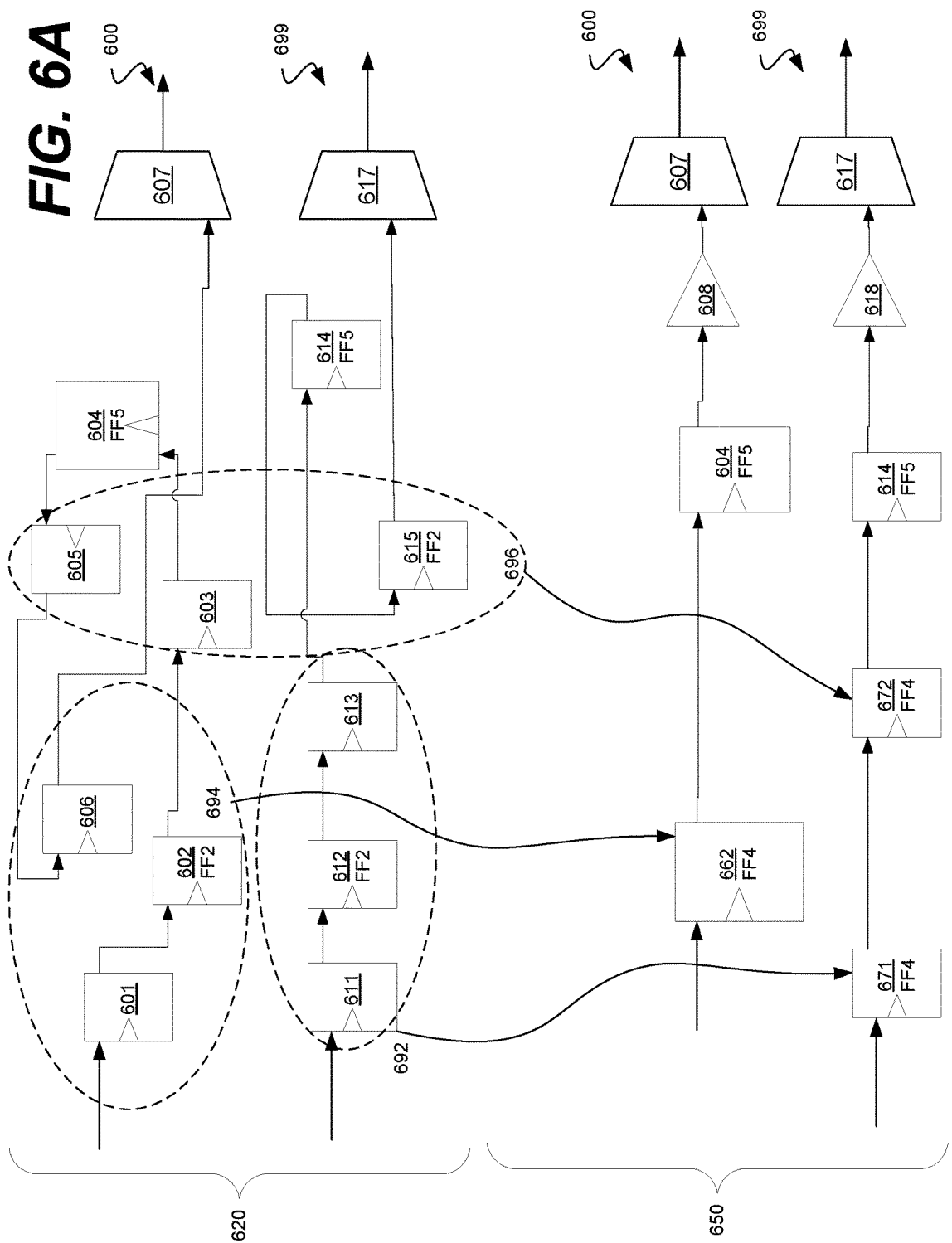

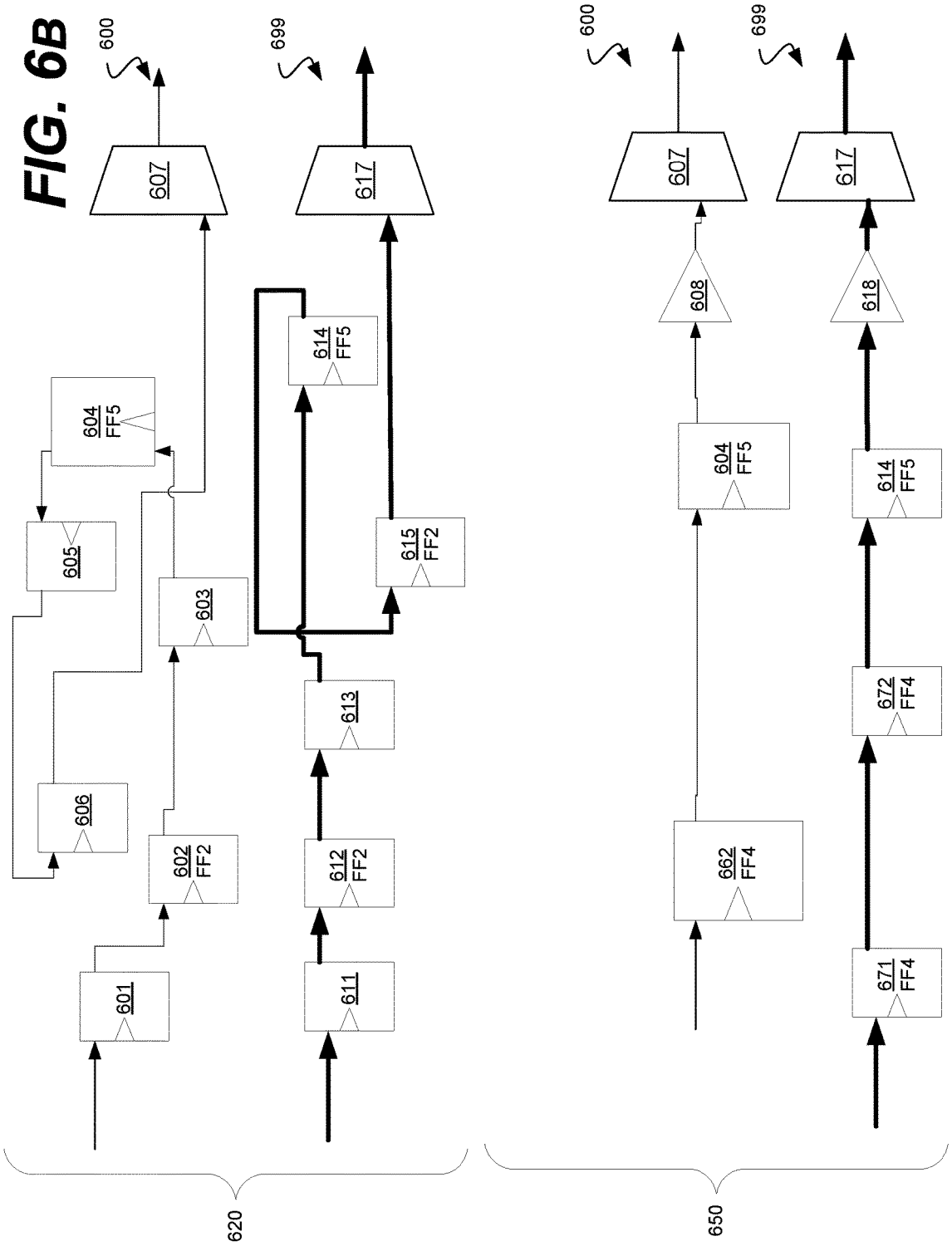

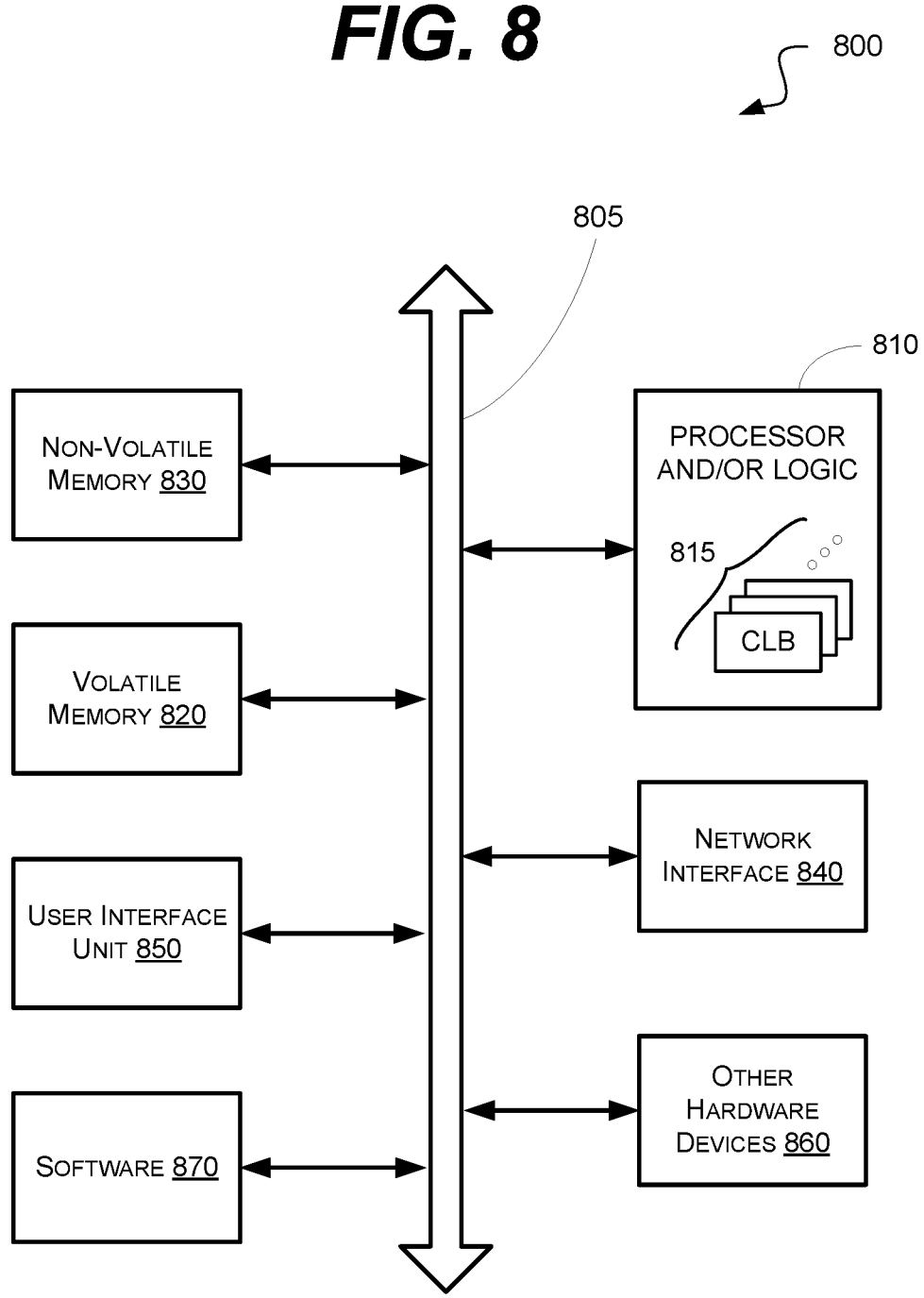

METHOD AND APPARATUS FOR SCAN CHAIN REORDERING AND OPTIMIZATION IN PHYSICAL IMPLEMENTATION OF DIGITAL INTEGRATED CIRCUITS WITH ON-CHIP TEST COMPRESSION

CROSS-REFERENCE TO RELATED APPLICATION

This application claims priority under 35 U.S.C. § 119 to Provisional Patent Application Ser. No. 62/435,056, entitled "METHOD AND APPARATUS FOR SCAN CHAIN REORDERING AND OPTIMIZATION IN PHYSICAL IMPLEMENTATION OF DIGITAL INTEGRATED CIRCUITS WITH ON-CHIP TEST COMPRESSION" filed on Dec. 15, 2016. The subject matter of this earlier filed application is hereby incorporated by reference.

TECHNICAL FIELD

This description relates to the design of electrical circuits, and more specifically to a method and apparatus for scan chain reordering and optimization in physical implementation of digital integrated circuits with on-chip test compression.

BACKGROUND

Design for testing or design for testability (DFT) generally includes integrated circuit (IC) design techniques that add testability features to a hardware product design. The added features often make it easier to develop and apply manufacturing tests to the designed hardware. Often the purpose of manufacturing tests is to validate that the product hardware contains no design or manufacturing defects that could adversely affect the product's correct functioning.

The most common method for delivering test data from chip inputs to internal circuits under test (CUT), and observing their outputs, is called scan-design. In scan-design, registers or timing elements (e.g., flip-flops or latches) in the design are connected in one or more scan chains, which are used to gain access to internal nodes of the chip. Test patterns are shifted in via the scan chain(s), functional clock signals are pulsed to test the circuit during the "capture cycle(s)", and the results are then shifted out to chip output pins and compared against the expected "good machine" results.

Straightforward application of scan techniques on a big digital IC can result in large vector sets with corresponding long tester time and memory requirements. The scan test compression techniques and circuits are commonly used in big digital ICs, such as CPU and SOC designs. Test compression techniques address this problem, by decompressing the scan inputs on chip and compressing the test outputs. For a fixed number of scan IOs in a given design, the scan chains in compression mode are much shorter in length than the scan chains without compression technique applied. The test data going through the short compression chains take a lot fewer clock cycles and therefore lot less times. This will reduce the chip test times significantly.

In addition to being useful for manufacturing "go/no go" testing, scan chains can also be used to "debug" chip designs. In this context, the chip is exercised in normal "functional mode" (for example, a computer or mobile-phone chip might execute assembly language instructions). At any time, the chip clock can be stopped, and the chip re-configured into "test mode". At this point the internal state can be dumped out, or set to any desired values, by use of the scan chains. Another use of scan to aid debug includes scanning in an initial state to all memory elements and then going back to functional mode to perform system debug. One advantage of this is to bring the system to a known state without going through many clock cycles.

SUMMARY

According to one general aspect, an apparatus may include a digital circuit receiver circuit and a scan chain reorder circuit. The digital circuit receiver circuit configured to: receive a circuit model file that includes logic circuits that are represented by respective cells, wherein a plurality of cells are arranged in an ordered scan chain, and insert, in to the circuit model file, a dummy cell at an end of the ordered scan chain. The scan chain reorder circuit configured to reorder the ordered scan chain to a reordered scan chain based, wherein the scan-chain reorder circuit is configured to maintain a start cell and an end cell of the ordered scan chain as a start cell and an end cell of the reordered scan chain.

According to another general aspect, a computer program product for adjusting a timing of a digital circuit may be tangibly embodied on a computer-readable medium. The computer program may include executable code that, when executed, is configured to cause a data processing apparatus to: receive a circuit model that includes logic circuits that are represented by respective cells, wherein a plurality of cells are arranged in at least one ordered scan chain; insert, in to the circuit model, a dummy cell at an end of the at least one ordered scan chain; reorder the at least one ordered scan chain to a reordered scan chain based, at least in part, upon a set of constraints.

According to another general aspect, a method may include receiving a circuit model that includes logic circuits that are represented by respective cells, wherein a plurality of cells are arranged in at least one ordered scan chain. The method may include inserting, in to the circuit model, a dummy cell at an end of the at least one ordered scan chain. The method may include reordering the at least one ordered scan chain to a reordered scan chain based, at least in part, upon a set of constraints.

The details of one or more implementations are set forth in the accompanying drawings and the description below. Other features will be apparent from the description and drawings, and from the claims.

A system and/or method for the design of electrical circuits, and more specifically to a method and apparatus for scan chain reordering and optimization in physical implementation of digital integrated circuits with on-chip test compression, substantially as shown in and/or described in connection with at least one of the figures, as set forth more completely in the claims.

BRIEF DESCRIPTION OF THE DRAWINGS

FIG. 1 is a block diagram of an example embodiment of a system in accordance with the disclosed subject matter.

FIG. 3A is a block diagram of an example embodiment of circuits in accordance with the disclosed subject matter.

FIG. 5A is a block diagram of an example embodiment of circuits in accordance with the disclosed subject matter.

FIG. 6A is a block diagram of an example embodiment of circuits in accordance with the disclosed subject matter.

FIG. 6B is a block diagram of an example embodiment of circuits in accordance with the disclosed subject matter.

FIG. 8 is a schematic block diagram of an information processing system that may include devices formed according to principles of the disclosed subject matter.

Like reference symbols in the various drawings indicate like elements.

DETAILED DESCRIPTION

Figure 2A:
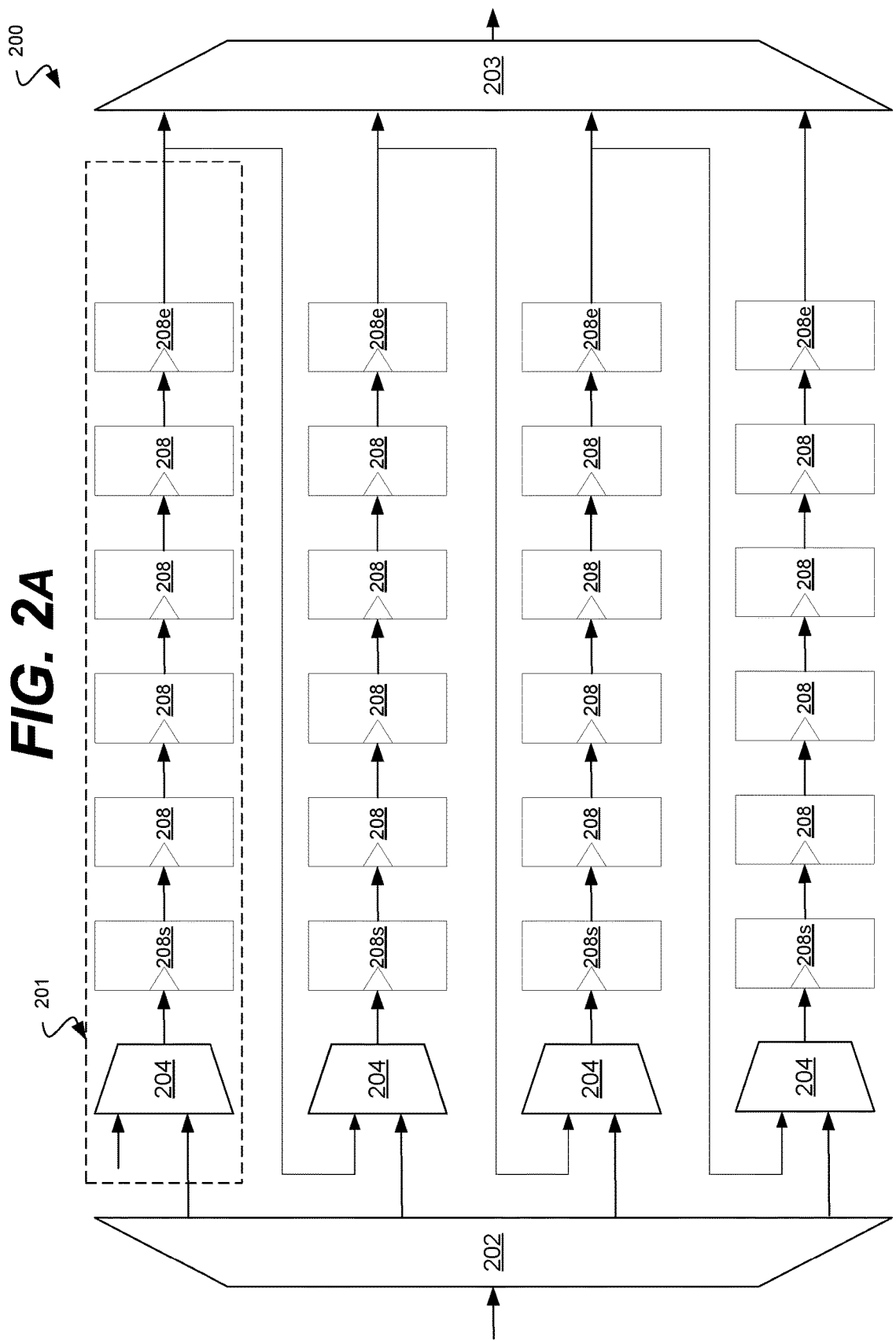
FIG. 2A is a block diagram of an example embodiment of a system in accordance with the disclosed subject matter.

Various example embodiments will be described more fully hereinafter with reference to the accompanying drawings, in which some example embodiments are shown. The present disclosed subject matter may, however, be embodied in many different forms and should not be construed as limited to the example embodiments set forth herein. Rather, these example embodiments are provided so that this disclosure will be thorough and complete, and will fully convey the scope of the present disclosed subject matter to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, and so on may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present disclosed subject matter.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosed subject matter.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a block diagram of an example embodiment of a system 100 in accordance with the disclosed subject matter. In the illustrated embodiment, during the integrated circuit design process, a digital circuit model 102 may be created. It may be desirable to adjust the circuit cells used to realize the digital circuit model 102. The components of system 100 may be employed to adjust the circuit cells associated with the model 102 as described below.

In the illustrated embodiment, the system 100 may be employed to adjust the digital circuit model 102 before performing physical manufacture. In another embodiment, the system 100 may be employed to adjust or alter the scan chains 106 of the model 102 (or resulting modified digital circuit model 108) earlier in the design process (e.g., during synthesis). It is understood that the above are merely a few illustrative examples to which the disclosed subject matter is not limited.

In one embodiment, the system 100 may receive a digital circuit model 102. In various embodiments, the digital circuit model 102 may include a physically synthesized, or laid out model. In another embodiment, the model 102 may include a representation of the circuit intermediate to the two ends of the design process. It is understood that the above are merely a few illustrative examples to which the disclosed subject matter is not limited.

The model 102 may include a plurality of logic circuits or representations thereof. In some embodiments, the model 102 may include a representation of a processor, system on a chip (SoC), memory circuit, or other circuit. In various embodiments, the logic circuit may include combinatorial logic circuits that are divided by register elements (e.g., flip-flops, latches, and so on). In some embodiments, the logic circuit may be divided into relatively primitive logical functions. (e.g., AND gates, NOR gates, MUXes, and so on). Regardless of the level of granularity at which the logic circuits are divided into, as described below, they will be mapped or associated with respective cells 104 which are usually part of standard library cells.

In the illustrated embodiment, at least a portion of those register elements may be arranged into a plurality of scan chains 106. For example, in some embodiments, a scan chain 106 may include registers found within a single functional unit block (e.g., a floating point unit, a load/store unit, and so on), such that testing may be performed on targeted portions of the circuit model 102. In various embodiments, a single function unit block may include a plurality of scan chains 106. It is understood that the above are merely a few illustrative examples to which the disclosed subject matter is not limited.

In various embodiments, each scan chain 106 may include a linear series of elements. As described above, the majority (if not all) of these elements may include registers or timing cells such as scan flip-flops. In such an embodiment, the timing cells may be thought of as a string or path of timing circuit cells 104 forming a large shift register. Each scan chain 106 may include a first or starting element or cell where bits are shifted into, and a last or ending element or cell where bits are shifted out of. In between the start and end elements may be any number of middle or intermediate scan chain cells. The scan chains 106 are discussed in greater detail in reference to the other figures.

In the current embodiment, the model 102 will be described as including a number of circuit cells 104 that represent or are associated with the logic circuits. In such an embodiment, the circuit model 102 may have already undergone part of the layout, or place and route process. In such an embodiment, each of the cells 104 may include standard cells. Cells that perform the same logic function, but differ for other reasons, such as physical dimensions or characteristics (e.g., single-row height vs. multi-row height, increased drive strength, mirrored or flipped, and so on) may be thought of as belonging to a single cell family.

The circuit model 102 may be received by a digital circuit receiver 110. The digital circuit receiver 110 may be configured to check the correctness or validity of the circuit model 102 against a predefined set of rules or parameters 111. These rules and parameters 111 may vary based upon the embodiment.

In the illustrated embodiment, the system 100 may include a scan chain re-orderer 112 which can be a computer software program (for example, it can be part of place and route EDA tool). The scan chain re-orderer 112 may be configured to alter the order of one or more scan chains 106.

In various embodiments, as the elements in the scan chain 106 also operate as functional register elements in a logic circuit (e.g., a floating point unit) when the cells 104 are placed during the place and route operation (not shown), more weight may be given to placing the cells 104 according to their functional use in the logic circuit, than in their use in the scan chain 106. Therefore, cells 104 that are next to each other logically within the scan chain 104 may be quite distant in physical layout of the circuit. This may cause a scan chain 106 to have very long wire connections resulting in routing and congestion problem in the physical layout, and even scan chain shift timing problems due to long wire delays. In such an embodiment, the scan chain re-orderer 112 may be configured to re-order or re-connect the individual elements in the scan chain 106 based on the physical placement of the scan cells so that the long cell connections and routing congestion problem gets minimized.

However, the traditional scan chain re-orderer such as the built-in scan chain reordering feature in most of the physical place and route EDA tools has limitation on large integrated circuits such as CPU and SOCs which often have on-chip scan compression hardware inserted during design to reduce silicon test time, and therefore manufacturing cost. The limitation in the place and route tools on compressed scan chains is that the last scan element in each scan chain is designated as STOP point of the chain for scan chain reordering in physical place and route tools. This leads to the last scan cells in the compressed scan chains unable to be reordered. Since there can be a large number of the compressed scan chains in a big design, the number of the last scan cells of the compressed chains can be in a large number also. In such cases, there still can be routing and congestion problems due to these cells not be reordered. In contrary, the first scan cells of the compressed chains can be reordered just like the other scan cells in the chains since the START point for reordering is usually a combinational cells such as a mux before the first scan element in the compressed scan chain. So to further improve physical design and chip performance, there is a need to address the scan reordering issue of the last scan cells of the compressed scan chains in large CPU and SOC designs.

In the illustrated embodiment, the scan chain re-orderer 112 may be configured to add a dummy end element 108 at the very end of the scan chain 106. In such an embodiment, the original end element of the scan chain 104 may become a middle or intermediate element. In such an embodiment, the scan chain re-orderer 112 may be capable of moving or reordering the original end element of the scan chain 104, and instead not move the dummy endpoint 108.

As described below, in various embodiments, the scan chain re-orderer 112 may be configured to move scan chain elements from a first scan chain to a second chain 106, or even a third scan chain 106. In one such embodiment, the scan chains 106 may all be part of the same clock domain or functional unit bock (e.g., all within the floating-point unit).

In some embodiments, the scan chain re-orderer 112 may be configured to reorder the scan chains 106 based upon one or more criteria. In various embodiments, the criteria may include timing, power, routing, specific order requirements. It is understood that the above are merely a few illustrative examples to which the disclosed subject matter is not limited.

In some embodiments, the system 100 may include a chain endpoint adjuster 116. The chain endpoint adjuster 116 may be configured to remove the dummy endpoint 108 from any scan chains 106 where it was added. In some embodiments, the chain endpoint adjuster 116 may be more selective and only remove the dummy endpoint 108 where it is determined that removing it does not alter or cause the chain to fail to meet one or more specified criteria (e.g., power, timing, and so on). For example, in some embodiments, the dummy endpoint 108 may include a buffer or other cell that increases the drive strength of the scan chain 106. It is understood that the above is merely one illustrative example to which the disclosed subject matter is not limited.

In the illustrated embodiment, either the scan chain re-orderer 112 or chain endpoint adjuster 116 may generate a modified digital circuit model 108. This modified digital circuit model 108 may include the modified or reordered scan chain(s) 194. This modified circuit model 108 may also include a number of scan chains 106 that were not re-ordered by the scan chain re-orderer 112. It is understood that the above are merely a few illustrative examples to which the disclosed subject matter is not limited.

In various embodiments, this new or adjusted digital circuit model 108 may then be reviewed or processed by other tools. For example, a static and/or dynamic timing evaluator may perform a more detailed and accurate form of timing analysis on the model. In another embodiment, a physical synthesizer may be employed to turn the digital circuit model 108 into a circuit physical model 192 that includes information needed to physically manufacture the digital circuit.

In various embodiments, the results of these other tools may be fed back through the system 100, for additional passes or to re-evaluate a modified digital circuit model 108. It is understood that the above are merely a few illustrative examples to which the disclosed subject matter is not limited.

FIG. 2A is a block diagram of an example embodiment of a system 200 in accordance with the disclosed subject matter. In the illustrated embodiment, the system 200 is shown before the addition or insertion of any dummy endpoints.

In the illustrated embodiment, the system 200 may include a decompressor 202 that allows one or more input bits to be shifted in the various scan chains 201. The system 200 may also include a compressor 203 that allows for the output of the various scan chains 201 to be shifted out as a single bit or as fewer bits than the number of internal chains between the decompressor 202 and compressor 203. Further, each scan chain 201 may include an input multiplexer (MUX) 204 that determines if a specific scan chain is to receive input from the decompressor 202 or from the output of the last scan element of a prior scan chain 201 in the system 200.

In various embodiments, the decompressor 202 and compressor 203 can be formed by XOR type of combinatorial logic or the combination of combinatorial and sequential elements. The select pins of the input MUXs 204 may be controlled by a scan test mode signal. In such an embodiment, there may be two scan test modes: compression mode and uncompressed (a.k.a., compression bypass) mode. In such an embodiment, the scan chains 201 may be concatenated into long scan chains in compression bypass mode, or the short chains may be selected in compression scan mode that require less time and effort to scan. In such an embodiment, the scan chains 201 are described as being compressible, in that they may be shortened.

In the illustrated embodiment, each scan chain 201 may include a number of timing elements or cells 208. As described above, each scan chain 201 may include a starting or first element 208s, and an ending or final element 208e. In such an embodiment, the ending element 208e may send its output to both the compressor 203 and the next chain's input multiplexer 204. The scan chains 201 are shown in their idealized simple form. The scan chain reordering is carried out through electronic design automation (EDA) tools during the physical design of the integrated circuits (ICs). The reordering of the compressed scan chains may be to disconnect and re-connect the scan cells in the scan chains based on physical placement, routing and/or timing information to achieve intended physical design targets and therefore chip performance on silicon.

In the normal setup and flow supported in the EDA physical IC design tools for scan chain reordering, a START point and a STOP point will be chosen as the connecting point to start and end the scan chain during reordering. For designs with on-chip compression such as, for example, that shown in FIG. 2A, The START point is the output pin of MUX 204; and the STOP point is the scan data input of the last scan cell 208e. Constrained by the connections of the last scan elements 208e, conventional scan reordering methods will not reorder these last scan elements in the compressed scan chains. In a large digital system, due to the large number of the registers, which will be mapped to scan flops in physical implementation, the numbers of the compressed chains can be large. For a high performance central processor unit (CPU) or large system-on-a-chip (SOC), there can be thousands of scan chains; and the number of scan chains can easily be doubled to achieve more aggressive test time reduction target since the scan chains will be even shorter; and the on-chip compression will have higher compression ratio in the design.

Figure 2B:
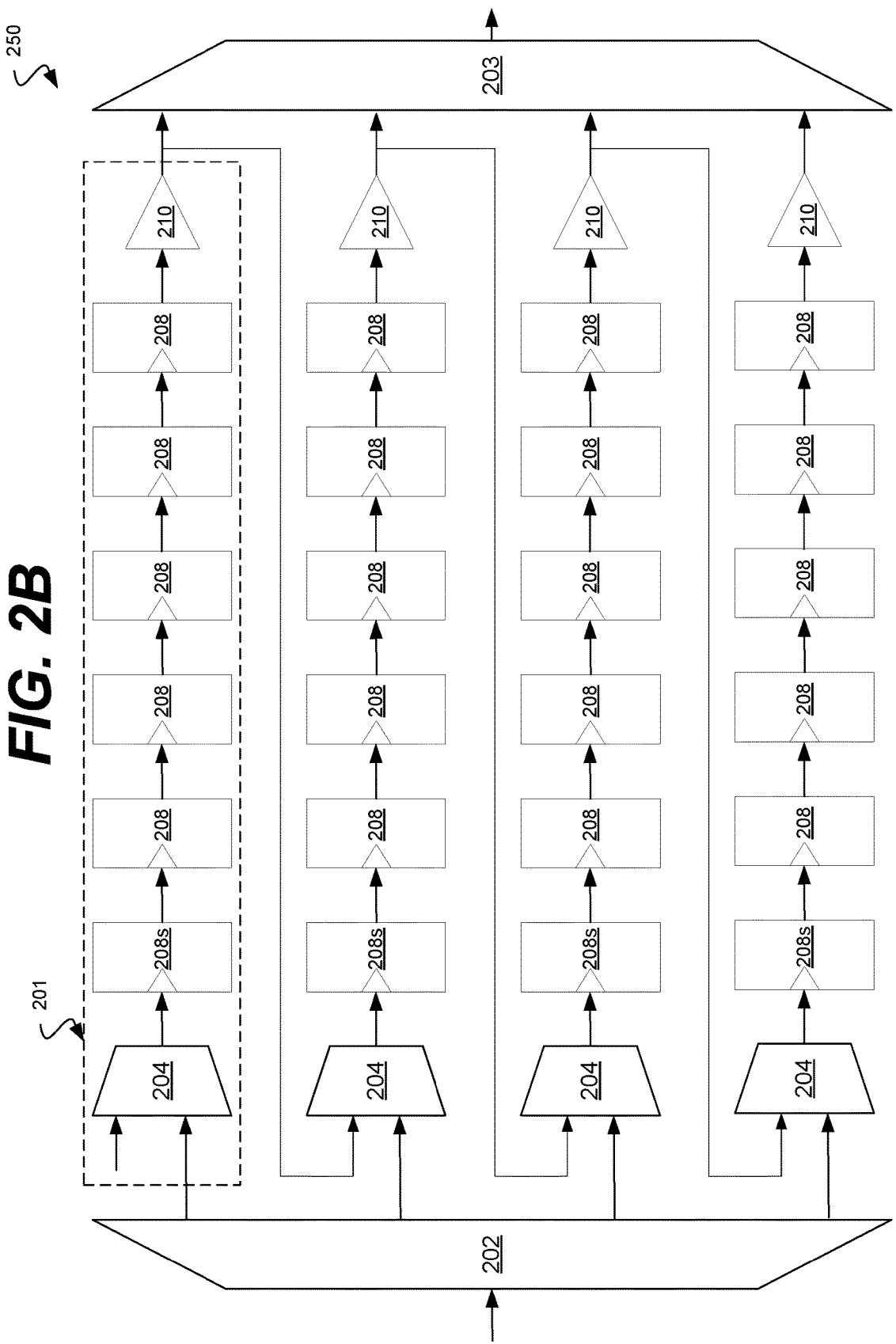
FIG. 2B is a block diagram of an example embodiment of a system in accordance with the disclosed subject matter.

FIG. 2B is a block diagram of an example embodiment of a system 250 in accordance with the disclosed subject matter. In the illustrated embodiment, the system 250 is shown before the addition or insertion of any dummy endpoints 210.

As described above, the system 250 may include a decompressor 202 and a compressor 203. Each scan chain 201 may include an input multiplexer (MUX) 204, a starting element 208s, and a plurality of middle or intermediate elements 208. However, in the illustrated embodiment, the end element is now the dummy element 210, instead of the register 208e of FIG. 2A. The previous end element 208e is now merely a middle element 208. In such an embodiment, the scan chain re-orderer may be able to move or rearrange the previous end element 208e.

FIG. 3A is a block diagram of an example embodiment of circuits 320 & 350 in accordance with the disclosed subject matter. In the illustrated embodiment, the circuits 320 & 350 may both include representations or embodiments of a scan chain 300. For simplicity, the scan chain 300 is only a representative part of the scan chain which is the scan chain segment close to the end of the chain. It illustrates some scan cells 302-308 and their placement as well as their connections. The scan chain ends a MUX at which the last scan cell connected to one of its inputs.

In the illustrated embodiment, the scan chain may include four timing elements 302, 304, 306, and 308. The scan chain 300 may provide its output to the output multiplexer 310 which may then choose between the output of the scan chain 300 and other scan chains (not shown) to output from the chip. The scan chain 300 may provide its output to the next scan chain (not shown).

In the illustrated embodiment, the circuit 320 shows the scan chain 300 in a semi-chaotic state. The elements of the scan chain 300 are ordered elements 302, 304, 306, and 308. That ordering is not based upon the physical (or proposed physical) layout of the elements, but upon other criteria (e.g., an order the elements were first mentioned in the register-transistor-logic (RTL) file). As shown, such an ordering creates a loop in which the endpoint element 308 is far away from the output MUX 310. In a traditional reordering technique, the elements 302, 304 and 306 may be reordered but the end element 308 would never be changed. In this case, the endpoint element 308 would always be far away from the output MUX 310.

In the illustrated embodiment, the circuit 350 shows the same ordering of elements 302, 304, 306, and 308. However, a dummy element, such as a buffer cell, as an endpoint 312 has been inserted into the chain 300. Note that the dummy element may include a buffer cell or sequential cell such as a latch or a flop as long as the insertion of the dummy element will not alter the functional logic state of the design. Now the reorder technique may alter the order of the elements 304, 306, and 308 and allow the element closest to the MUX 310 or buffer 312 to serve as the functional output of the chain 300.

Figure 3B:
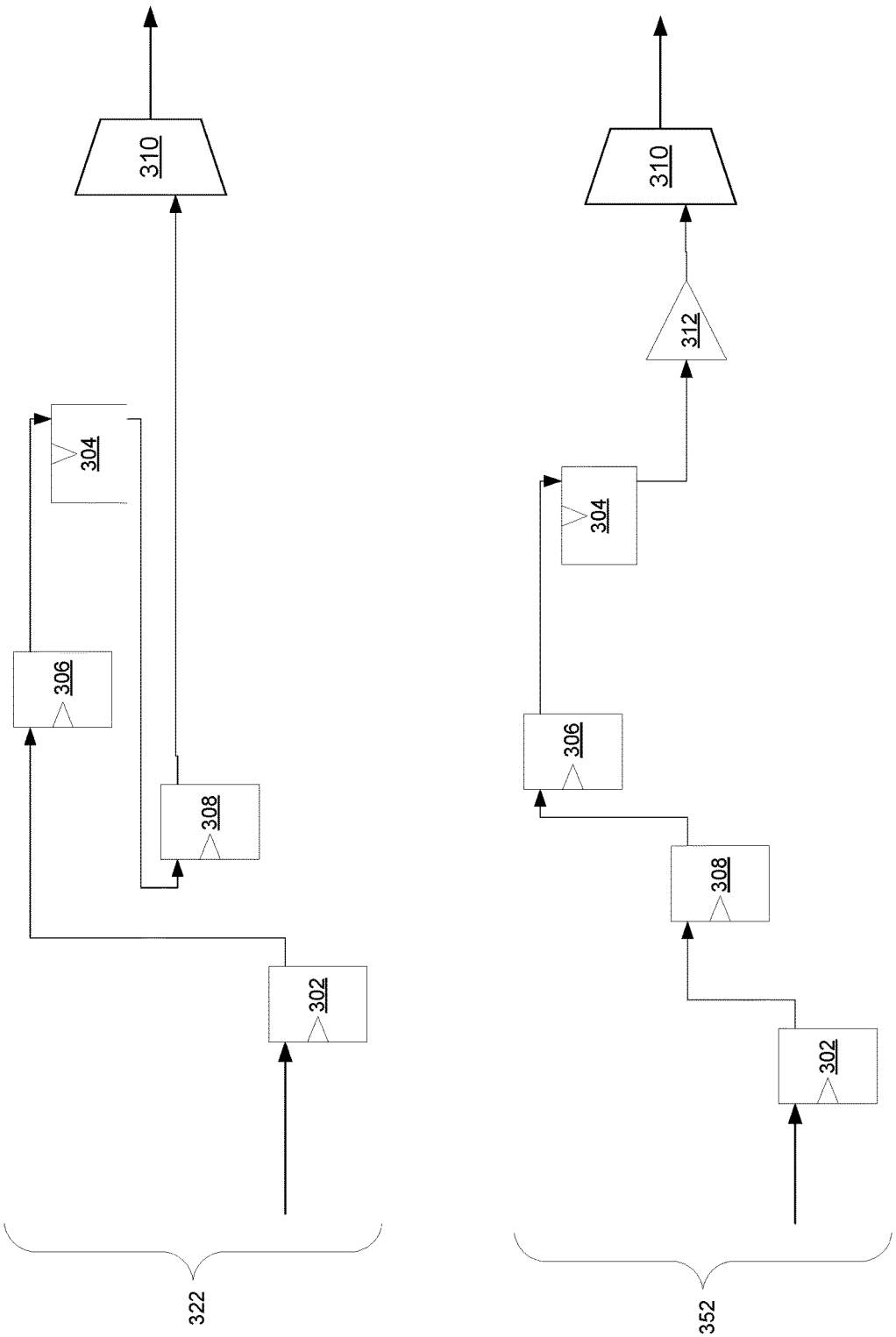
FIG. 3B is a block diagram of an example embodiment of circuits in accordance with the disclosed subject matter.

FIG. 3B is a block diagram of an example embodiment of circuits 322 & 352 in accordance with the disclosed subject matter. In the illustrated embodiment, the circuits 322 & 352 may both include representations or embodiments of a scan chain 300.

Circuit 322 shows a potential reordering of the scan chain 300, without the benefit of the dummy buffer 312 (in some embodiments, named as STOPBUF). In such an embodiment, the endpoint 308 may not be reordered. Therefore, the chain 300 may only be reordered in the sequence of the elements 302, 306, 304, and 308. Therefore the distance between the endpoint 308 and the MUX 310 is maintained and not optimal.

Conversely, circuit 352 shows a potential reordering of the scan chain 300 with the benefit of the dummy buffer STOPBUF 312. Now that element 308 is movable, the reorder technique may arrange the chain in the order of elements 302, 308, 306, and 304. As can be seen the path taken by the chain 300 is much more direct. The last timing element 304 outputs to the dummy buffer 312, which is close to the MUX 310.

Figure 3C:
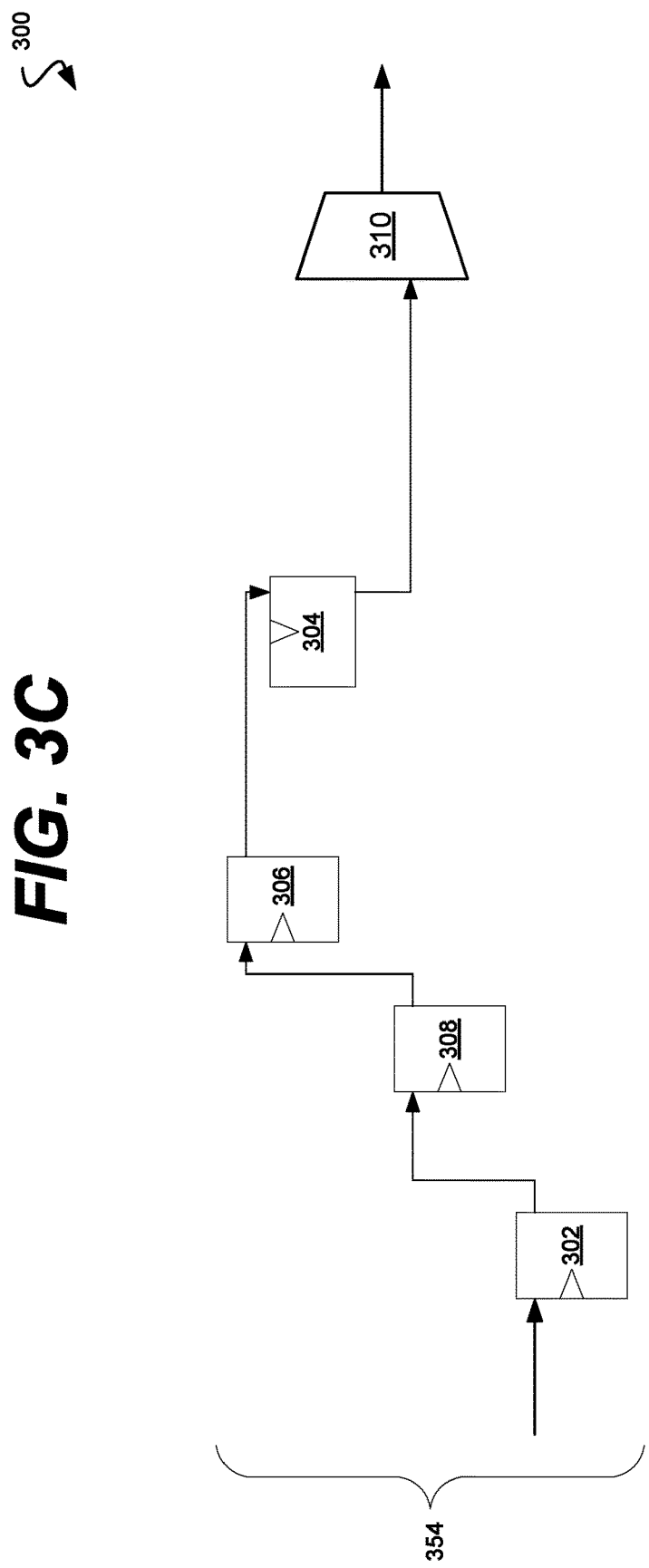
FIG. 3C is a block diagram of an example embodiment of a circuit in accordance with the disclosed subject matter.

FIG. 3C is a block diagram of an example embodiment of a circuit 354 in accordance with the disclosed subject matter. In the illustrated embodiment, the circuit 354 may include a representation or embodiment of a scan chain 300.

As described above, in various embodiments, the dummy endpoint 312 may be removed from the circuit 354 once the reordering technique has completed. In such an embodiment, any delay or space requirements imposed by the dummy endpoint 312 may not be present in the physical circuit. In such an embodiment, the dummy endpoint 312 may be a virtual element. In the illustrated embodiment, the chain 300 is ordered to go element 302, 308, 306, 304, and then directly output to MUX 310.

Figure 4:
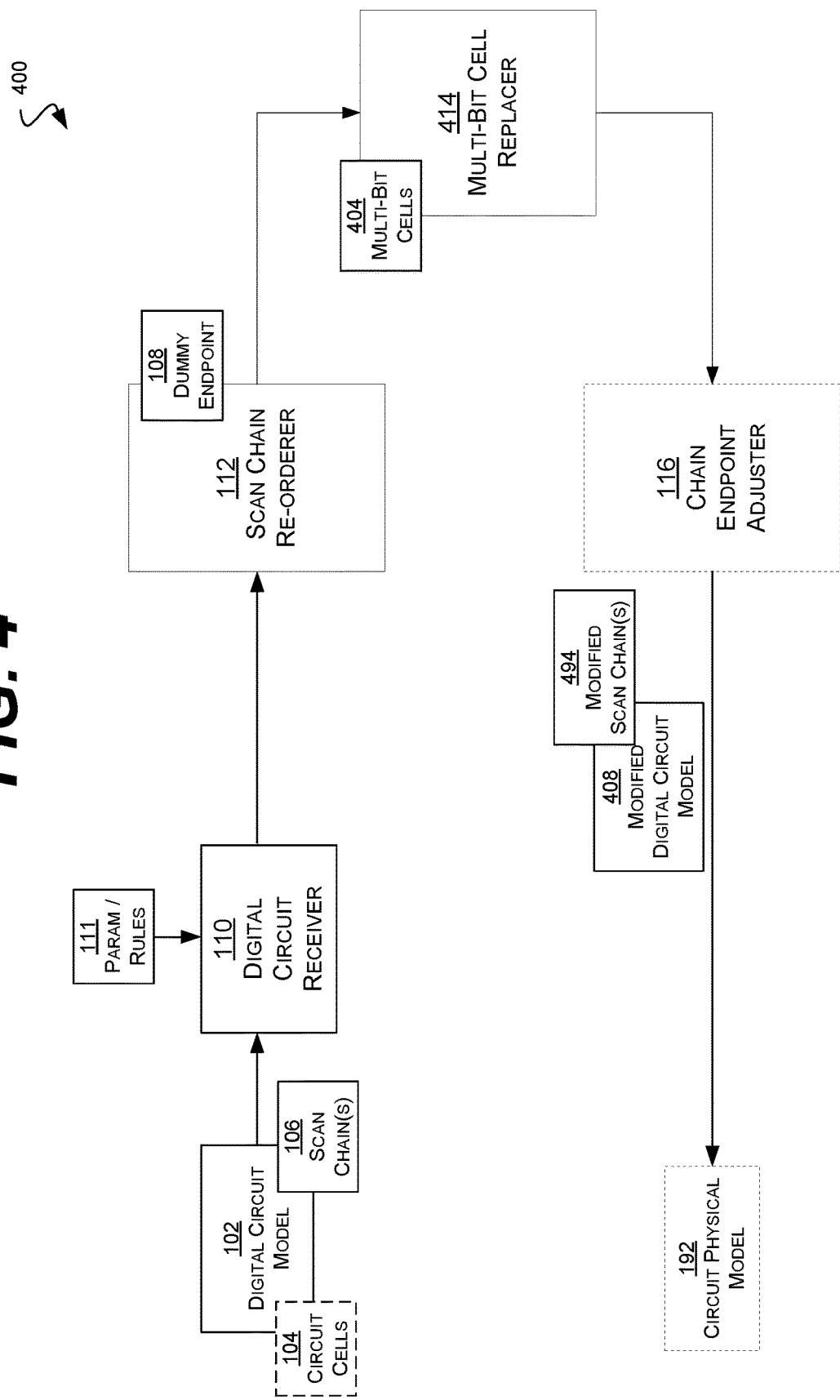
FIG. 4 is a block diagram of an example embodiment of a system in accordance with the disclosed subject matter.

FIG. 4 is a block diagram of an example embodiment of a system 400 in accordance with the disclosed subject matter. In the illustrated embodiment, during the integrated circuit design process, a digital circuit model 102 may be created. It may be desirable to adjust the circuit cells used to realize the digital circuit model 102. The components of system 100 may be employed to adjust the circuit cells associated with the model 102 as described below.

As described above, a digital circuit model 102 may be received by a digital circuit receiver circuit 110. The digital circuit model 102 may include a plurality of scan chains 106. These scan chains 106 may be re-ordered by the scan chain re-orderer 112. As part of this process a dummy endpoint 108 may be added or inserted into one or more scan chains 106.

In the illustrated embodiment, the system 400 may make use of multi-bit cells 404. In this context, a multi-bit cell, specifically, a multi-bit register, is a circuit cell 104 that combines the logical function of multiple gates or cells into a single pre-packaged cell. This may reduce the physical area and/or power requirements for the circuit cell 104.

For example, a traditional single-bit flip-flop cell would include a Data In (D), a Clock, and a Scan-In inputs (SI), and a Scan Enable input (SE), and have a Data Out (Q), and Scan Out outputs (SO). A multi-bit (e.g., a 4-bit) flip-flop cell would have includes for Data In 1 (D1), Data In 2 (D2), Data In 3 (D3), Data In 4 (D4), Clock, and Scan Ins 1-4. The multi-bit flip-flop cell would have Data Outs 1-4 (Q1-4) and Scan Outs 1-4. Each of the Data Ins and Data Outs would operate semi-independently in that they would still have the same logical function as a single bit flip-flop, but the single clock would control all four flip-flops.

In such an embodiment, the major structural difference is often the shared clock network between all the single-bit flip-flops of a multi-bit flip-flop. In a multi-bit cell 404, all the single-bit logical-portions of the cell are physically co-located, which resolves many physical design implementation challenges. Multi-bit flip-flops are a step closer to optimal use of resources and offer many advantages over single-bit flip-flops Such advantages may include a system-on-a-chip (SoC) implementation using multi-bit cell results in lesser number of clock sinks as seen by the clock-tree synthesis tool. Hence, their usage should result in less power consumption by the clock in all the flip-flops as the overall capacitance driven by a clock net gets reduced. This may also reduce clock skew in sequential gates as the clock paths are balanced internally in a whole multi-bit cell. The use of multi-bit flip-flops should result in smaller area consumption as the total number of clock buffers should reduce, resulting in lesser congestion. Further, the multi-bit cell 404 usage should improve the timing numbers, due to shared logic (in clock gating or set-reset logic) and an optimized multi-bit circuit and layout from library team. It is understood that the above are merely a few illustrative examples to which the disclosed subject matter is not limited.

In the illustrated embodiment, system 400 may include a multi-bit cell replacer 414. In various embodiments, the multi-bit cell replacer 414 may be included in the scan chain re-orderer 112. In the illustrated embodiment, multi-bit cell replacer 414 may be configured to replace a plurality of single-bit scan cells 104 within the scan chains 106 with a multi-bit scan cell 404. For example, 4 single-bit scan cells 104 may be replaced with a 4-bit multi-bit cell 404. In such an embodiment, the scan chain 106 may take up less space (both in terms of placement and routing) and less power. It is understood that the above is merely one illustrative example to which the disclosed subject matter is not limited.

In various embodiments, the digital cell model 102 may already include multi-bit cells 404. In such an embodiment, the multi-bit cell replacer 414 may be configured to replace a plurality of single-bit or multi-bit scan cells 104 within the scan chains 106 with a multi-bit scan cell 404. For example, 2 single-bit scan cells 104 and a 2-bit multi-bit scan cell 404 may be combined into a 4-bit multi-bit scan cell 404. Again, in such an embodiment, the scan chain 106 may take up less space (both in terms of placement and routing) and less power. It is understood that the above is merely one illustrative example to which the disclosed subject matter is not limited.

Further, the system 400 (or the system 100 of FIG. 1) may be configured to replace circuit cells 104 in the scan chains 106 with cells 104 that are logical the same (e.g., both 1-bit flip-flops) but take up a different physical footprint (e.g., rectangular vs. square, double-height vs. single-height, and so on). In various embodiments, this may reduce the space and/or power requirements imposed by the scan chain 106.

As described above, the system 400 may include a chain endpoint adjuster 116 configured to remove the dummy endpoint 108. The system 400 may generate a modified digital model 408 with the reordered or modified scan chain(s) 494. In such an embodiment, the modified scan chains 494 may include one or more multi-bit cells 404. In various embodiments, the modified digital model 408 may be employed to create a circuit physical model 192.

In various embodiments, the digital circuit model 102 may include a file or group of files. In some embodiments, the files may include text entries that denote various cells 104. In such an embodiment, some of these text portions may indicate that the represented cell 104 is an endpoint or a start point, and what scan chain (if any) the cell 104 is included by.

In such an embodiment, the scan chain re-orderer 112 may be configured to edit (e.g., delete, insert, move, and so on) these text portions as part of reordering the scan chain. In various embodiments, these text portions may be in a specific hardware description language or in a more generic format (e.g., Extensible Markup Language (XML), JavaScript Object Notation (JSON), and so on). It is understood that the above are merely a few illustrative examples to which the disclosed subject matter is not limited.

FIG. 5A is a block diagram of an example embodiment of circuits 520 & 550 in accordance with the disclosed subject matter. In the illustrated embodiment, the circuits 520 & 550 may both include representations or embodiments of a scan chain 500.

In the illustrated embodiment, the scan chain 500 may include eighth timing cells 501, 502, 503, 504, 505, 506, 507, and 508. All of the timing cells are single-bit timing elements. The scan chain 500 may provide its output to the output multiplexer 510 which may then choose between the output of the scan chain 500 and other scan chains (not shown) to output from the chip. The scan chain 500 may provide its output to the next scan chain (not shown).

In the illustrated embodiment, the circuit 520 shows the scan chain 500 in a semi-chaotic state. The cells of the scan chain 500 are ordered cells 501, 502, 503, 504, 505, 506, 507, and 508. That ordering is not based upon the physical (or proposed physical) layout of the cells, but upon other criteria (e.g., an order the cells were first mentioned in the register-transistor-logic (RTL) file). As shown, such an ordering creates a loop in which the endpoint cell 508 is far away from the output MUX 510.

In the illustrated embodiment, the circuit 550 shows the same ordering of cells 501, 502, 503, 504, 505, 506, 507, and 508. However, a dummy or buffer endpoint 512 has been inserted into the chain 500. Now the reorder technique may alter the order of the cells 502, 503, 504, 505, 506, 507, and 508 and allow the cell closest to the MUX 510 or buffer 512 to serve as the functional output of the chain 500. In various embodiments, the chain 500 may be ordered using single-bit scan cells as described in reference to FIG. 3B.

Figure 5B:
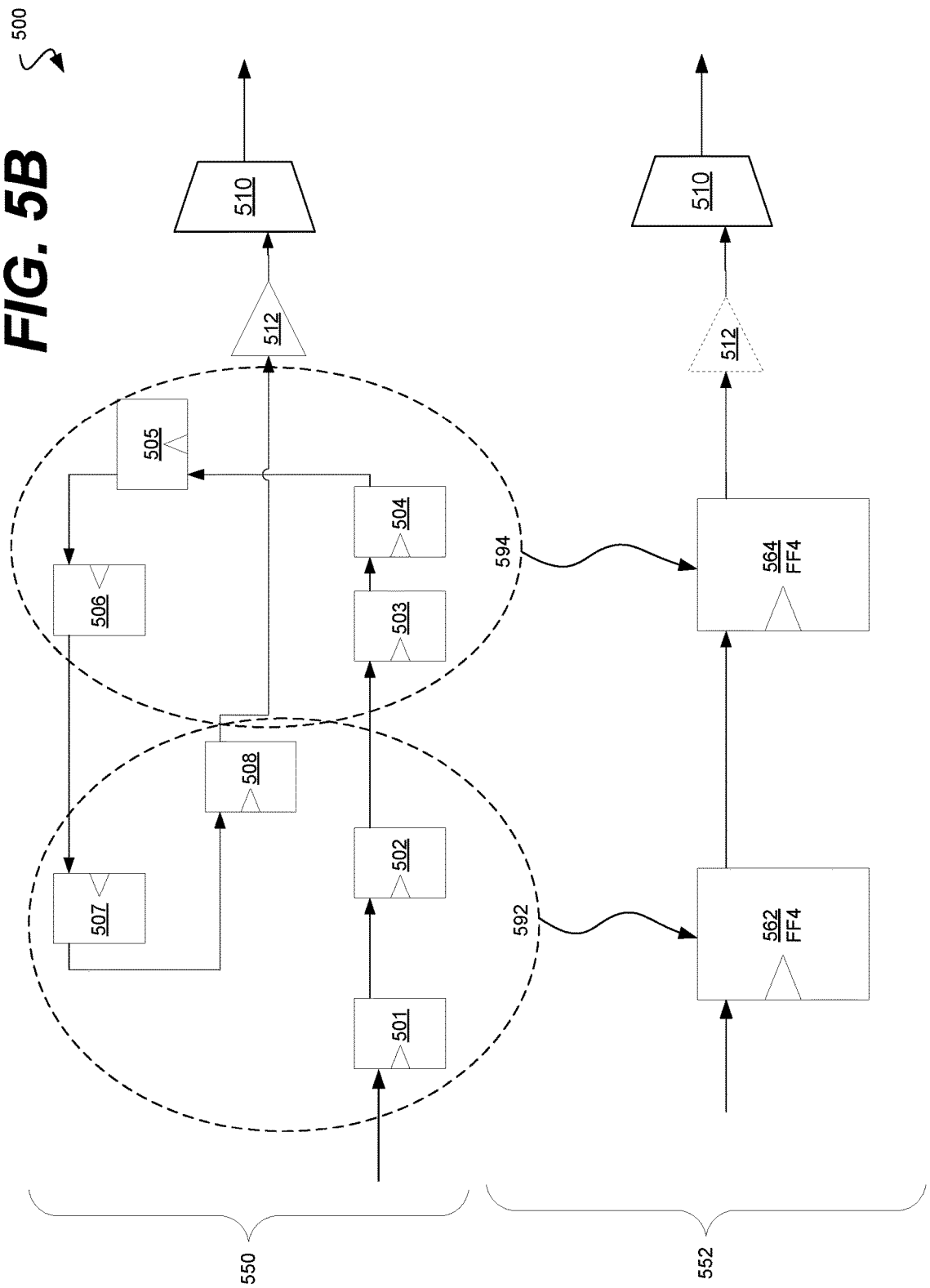
FIG. 5B is a block diagram of an example embodiment of circuits in accordance with the disclosed subject matter.

FIG. 5B is a block diagram of an example embodiment of circuits 550 & 552 in accordance with the disclosed subject matter. In the illustrated embodiment, the circuits 550 & 552 may both include representations or embodiments of a scan chain 500.

Due to the insertion of the dummy stop buffer (STOP-BUF) 512 in scan chain 500 after the last scan element 508, it not only freed cell 508 to be reordered, it also freed cell 508 to be combined with other scan cells to form a mbit scan cells for optimization and incur benefits of mbit cell conversion in the physical design.

Circuit 550 merely repeats the circuit 350 of FIG. 5A. However, in the illustrated embodiment, the reorder technique is configured to group multiple single-bit scan cells into multi-bit scan cells. For example, scan cells 501, 502, 507, and 508 (group 592) may be combined into a 4-bit scan cell 562 of circuit 552. Likewise, scan cells 503, 504, 505, and 506 (group 594) may be combined into a 4-bit scan cell 564.

In the illustrations, multi-bit scan cells are designated with the legend FF# where # shows the number of bits in the scan cell (e.g., 4, 3, 2, and so on). If no legend is used, the scan cell is a single-bit scan cell (e.g., cell 502).

In the illustrated embodiment, the circuit 552 has reformed the 8 single-bit cell (cells 501-508) scan chain 500 into a two 4-bit cell (cells 562, and 564) scan chain. In various embodiments, the dummy buffer 312 may remain or may be removed, as described above.

FIG. 6A is a block diagram of an example embodiment of circuits 620 & 650 in accordance with the disclosed subject matter. In the illustrated embodiment, the circuits 620 & 650 may both include representations or embodiments of scan chains 600 and 699.

Due to the completeness of FIG. 6A, the less complex FIG. 6B is shown. FIG. 6B includes the circuit 620 & 650 but does not explicitly show the groupings 692, 694, 696. Otherwise, FIGS. 6A and 6B are the same. The less complex FIG. 6B is merely provided as a curiously to the reader and will not be discussed separately.

In the illustrated embodiment, the version of chain 600 shown in circuit 620 includes the following timing cells: 1-bit cell 601, 2-bit cell 602, 1-bit cell 603, 5-bit cell 604, and 1-bit cell 605 and 606. Where, in circuit 620, the cell 606 is the endpoint of the chain 600 and outputs to the MUX 607.

In the illustrated embodiment, the version of chain 699 shown in circuit 620 includes the following timing cells: 1-bit cells 611, 2-bit cell 612, 1-bit cell 613, 5-bit cell 614, and the 2-bit cell 615. Where, in circuit 620, the cell 615 is the endpoint of the chain 699 and outputs to the MUX 617.

In various embodiments, the reorder technique may be configured to, not only reorder the sequence of the scan cell, combine scan cell into multi-bit scan cells, but also to combine scan cells across multiple scan chains (in this illustration two chains 600 & 699). In various embodiments, this cross-chin combining of cells may be allowed if the two (or more) chains are on the same clock domain or in the same functional unit block. For example, chains within the floating point unit (FPU) may all be on the FPU clock domain, whereas a chain in the load/store unit (LSU) may be on an LSU clock domain. It is understood that the above is merely one illustrative example to which the disclosed subject matter is not limited.

In the illustrated embodiment, the reorder technique may group the cells 611, 612, and 613 (group 692) into the 4-bit scan cell 671 of circuit 671. Likewise, the reorder technique may group cells 601, 602, and 606 (group 694) into the 4-bit timing cell 662 of circuit 650. This is similar to that seen in FIG. 5B but with the addition that smaller multi-bit scan cells (e.g., cells 602 and 612) may be combined with other single or multi-bit scan cells to create larger multi-bit cells (e.g., cell 662).

In the illustrated embodiment, the reorder technique may also combine or more scan cells between scan chains 600 and 699. Group 696 illustrates that, in one embodiment, the reorder technique may move scan cells 603 and 605 from chain 600 to chain 699. In the process it may combine those cells 603 and 605 with other cells (e.g., cell 615) to form the multi-bit cell 672.

In such an embodiment, the scan chain 600 shown in the reordered circuit 650 includes the 4-bit scan cell 662, the 5-bit scan cell 604, the dummy endpoint or buffer 608 and the MUX 607. The scan chain 699 shown in the reordered circuit 650 includes the 4-bit scan cell 671, the 4-bit scan cell 672, the 5-bit scan cell 614, the dummy endpoint or buffer 618 and the MUX 617. In various embodiments, an increase or decrease in the total number of bits in a scan chain may be acceptable as long as the total number of bits is within a predefined maximum value.

In the illustrated embodiment, the resultant multi-bit cells include the sum of the bits of the original cells. However, in various embodiments, it may be advantageous to combine the original cells into a scan cell that includes more bits than the sum of the original cells. For example, as the scan chain scan cells also perform logical functions in the logic circuit, the timing elements may be combined into multi-bit cells for other reasons. These multi-bit cells may include bits that aren't in the scan chain. In such an embodiment, the scan chain only makes use of a subset of the total bits in the multi-bit cell. It is understood that the above is merely one illustrative example to which the disclosed subject matter is not limited.

Figure 7A:
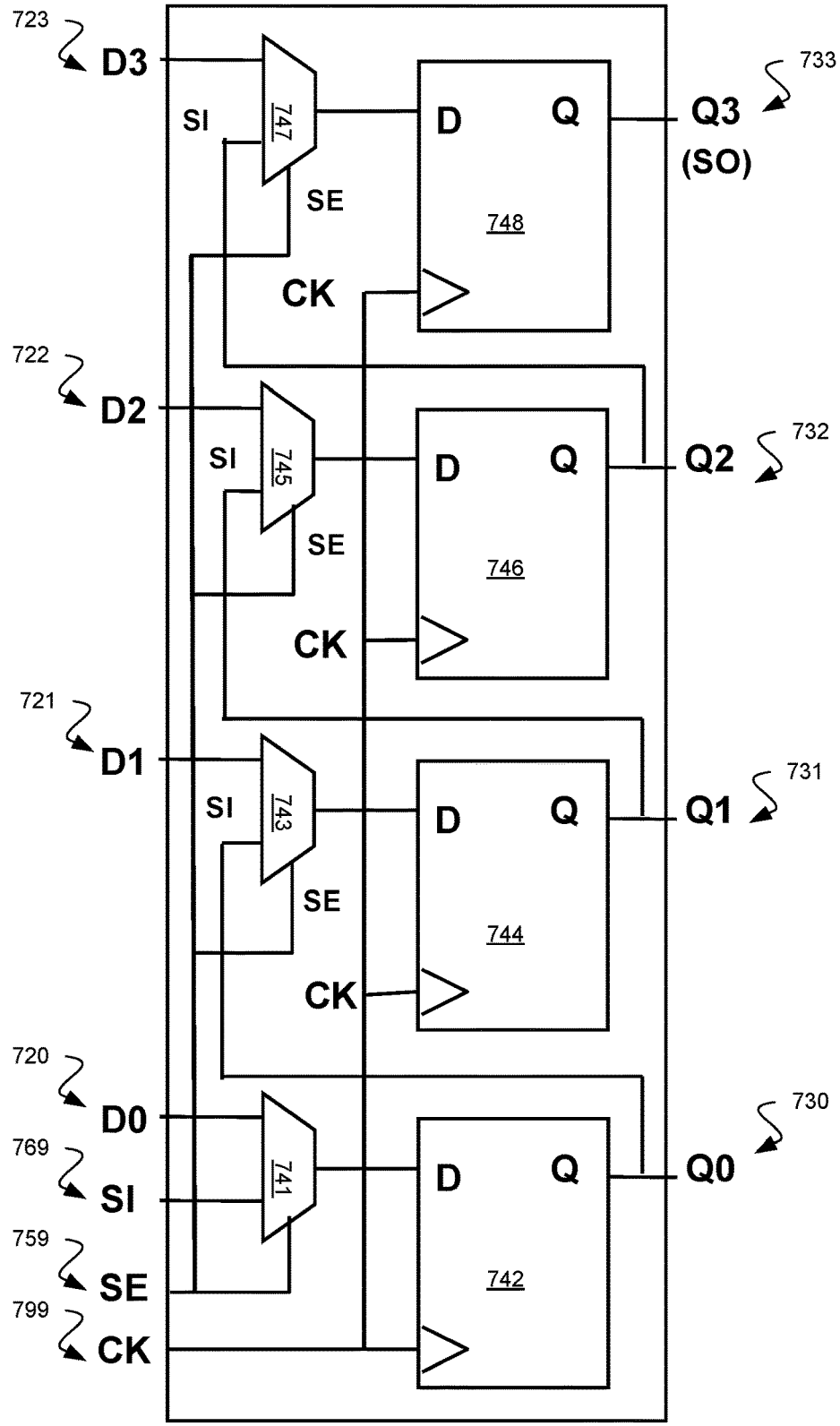
FIG. 7A is a block diagram of an example embodiment of a circuit in accordance with the disclosed subject matter.

FIG. 7A is a block diagram of an example embodiment of a circuit in accordance with the disclosed subject matter. In the illustrated embodiment is a multi-bit cell (mbit cell) 701 that may be employed in the disclosed subject matter. Specifically, a 4-bit serial scan cell is shown. In various embodiments, other forms of multi-bit cells may be employed.

In the illustrated embodiment, the multi-bit scan cell 701 includes the four flip-flops 742, 744, 746, and 748. These flip-flops are controlled by the clock signal 799. During normal or non-scan operation, flip-flip 742 receives as input signal D0 720 and outputs signal Q0 730. During normal or non-scan operation, flip-flip 744 receives as input signal D1 721 and outputs signal Q1 731. During normal or non-scan operation, flip-flip 746 receives as input signal D2 722 and outputs signal Q2 732. During normal or non-scan operation, flip-flip 748 receives as input signal D3 723 and outputs signal Q3 733.

During the scan operation (controlled by the scan enable (SE) signal 759), the MUX 741 may set the input of the flip-flop 742 to the scan input (SI) signal 769. During the scan operation, the MUX 743 may set the input of the flip-flop 744 to the output of the prior flip-flop (output Q0 730). During the scan operation, the MUX 745 may set the input of the flip-flop 746 to the output of the prior flip-flop (output Q1 731). During the scan operation, the MUX 747 may set the input of the flip-flop 748 to the output of the prior flip-flop (output Q2 7320). In such an embodiment, the four flip-flips 742, 744, 746, and 748 may be wired in series. The final output being the scan out (SO) signal 733 (which is also the output Q3 of flip-flop 748).

In the illustrated embodiment, the internal circuits form a scan chain inside as shown. This type of multi-bit scan cell 701 is often used in the actual physical design ICs since it can be maximally optimized to achieve smallest area and power, and highest speed. It is understood that the above is merely one illustrative example to which the disclosed subject matter is not limited.

Figure 7B:
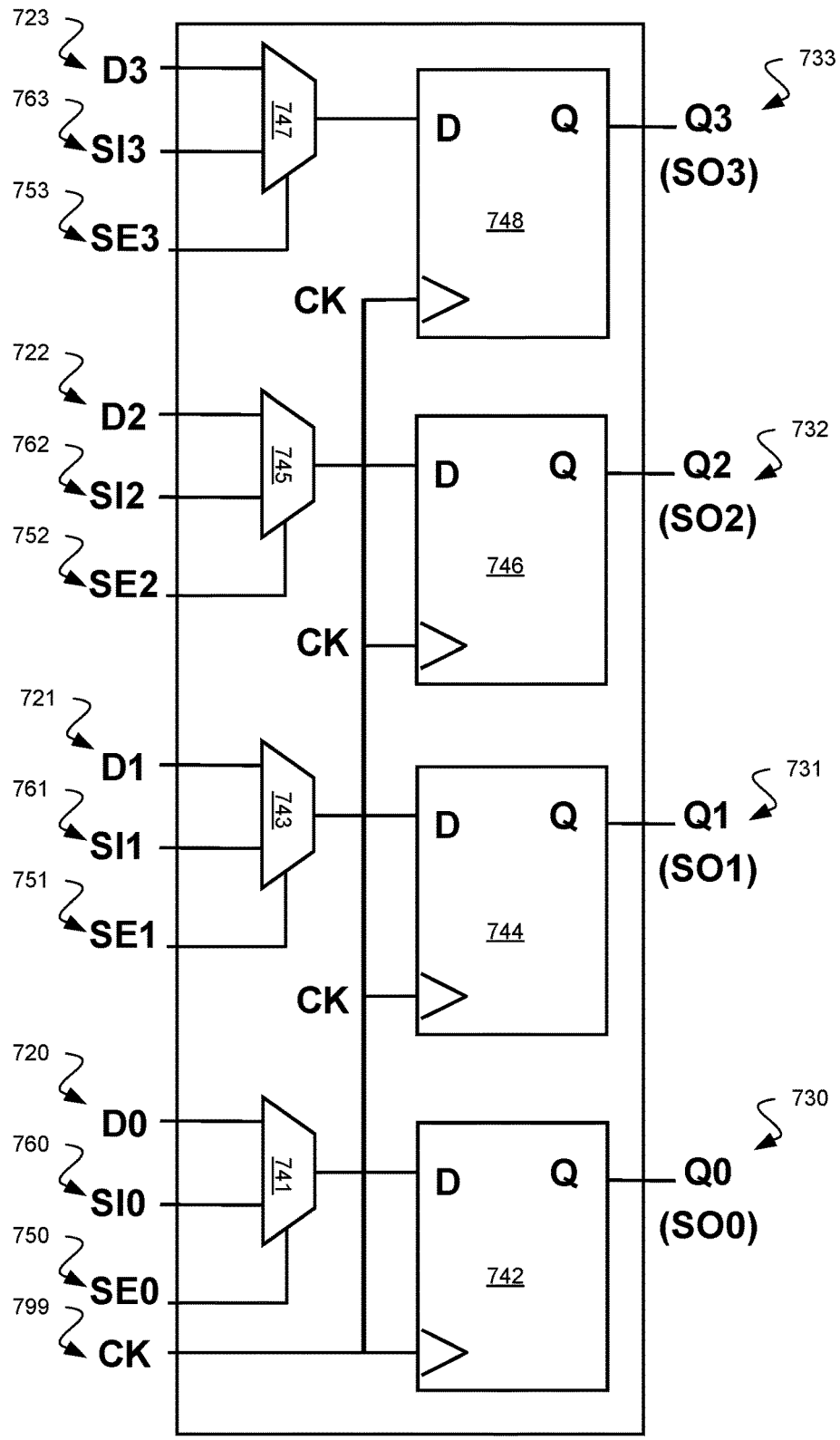
FIG. 7B is a block diagram of an example embodiment of a circuit in accordance with the disclosed subject matter.

FIG. 7B is a block diagram of an example embodiment of a circuit in accordance with the disclosed subject matter. In the illustrated embodiment is a multi-bit cell (mbit cell) 791 that may be employed in the disclosed subject matter. Specifically, a 4-bit parallel scan cell is shown. In various embodiments, other forms of multi-bit cells may be employed.

In the illustrated embodiment, the multi-bit scan cell 791 includes the four flip-flops 742, 744, 746, and 748. These flip-flops are controlled by the clock signal 799. During normal or non-scan operation, flip-flip 742 receives as input signal D0 720 and outputs signal Q0 730. During normal or non-scan operation, flip-flip 744 receives as input signal D1 721 and outputs signal Q1 731. During normal or non-scan operation, flip-flip 746 receives as input signal D2 722 and outputs signal Q2 732. During normal or non-scan operation, flip-flip 748 receives as input signal D3 723 and outputs signal Q3 733.

During the scan operation (controlled by the $0^{th}$ scan enable (SE0) signal 750), the MUX 741 may set the input of the flip-flop 742 to the $0^{th}$ scan input (SI0) signal 760. The output of the flip-flop 742 may be the $0^{th}$ scan output (SO0) signal 730 (which is also the output Q0 of flip-flop 742). During the scan operation (controlled by the $1^{st}$ scan enable (SE1) signal 751), the MUX 743 may set the input of the flip-flop 744 to the $1^{st}$ scan input (SI1) signal 761. The output of the flip-flop 744 may be the $1^{st}$ scan output (501) signal 731 (which is also the output Q1 of flip-flop 744). During the scan operation (controlled by the $2^{nd}$ scan enable (SE2) signal 752), the MUX 745 may set the input of the flip-flop 746 to the $2^{nd}$ scan input (SI2) signal 762. The output of the flip-flop 746 may be the $2^{nd}$ scan output (SO2) signal 732 (which is also the output Q2 of flip-flop 746). During the scan operation (controlled by the $3^{rd}$ scan enable (SE3) signal 753), the MUX 747 may set the input of the flip-flop 748 to the $3^{rd}$ scan input (SI3) signal 763. The output of the flip-flop 748 may be the $3^{rd}$ scan output (SO3) signal 733 (which is also the output Q3 of flip-flop 748). In such an embodiment, the four flip-flips 742, 744, 746, and 748 may be wired in parallel.

In the illustrated embodiment, the internal circuits are stacked together with only the clock signal 799 shared among the circuits. The four flip-flops do not form a single scan chain. This type of multi-bit scan cell is commonly used due to its very limited optimization for area, power and speed. In various embodiments, it may get used selectively. It is understood that the above is merely one illustrative example to which the disclosed subject matter is not limited.

FIG. 8 is a schematic block diagram of an information processing system 800, which may include semiconductor devices formed according to principles of the disclosed subject matter.

Referring to FIG. 8, an information processing system 800 may include one or more of devices constructed according to the principles of the disclosed subject matter. In another embodiment, the information processing system 800 may employ or execute one or more techniques according to the principles of the disclosed subject matter.

In various embodiments, the information processing system 800 may include a computing device, such as, for example, a laptop, desktop, workstation, server, blade server, personal digital assistant, smartphone, tablet, and other appropriate computers or a virtual machine or virtual computing device thereof. In various embodiments, the information processing system 800 may be used by a user (not shown).

The information processing system 800 according to the disclosed subject matter may further include a central processing unit (CPU), logic, or processor 810. In some embodiments, the processor 810 may include one or more functional unit blocks (FUBs) or combinational logic blocks (CLBs) 815. In such an embodiment, a combinational logic block may include various Boolean logic operations (e.g., NAND, NOR, NOT, XOR), stabilizing logic devices (e.g., flip-flops, latches), other logic devices, or a combination thereof. These combinational logic operations may be configured in simple or complex fashion to process input signals to achieve a desired result. It is understood that while a few illustrative examples of synchronous combinational logic operations are described, the disclosed subject matter is not so limited and may include asynchronous operations, or a mixture thereof. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

The information processing system 800 according to the disclosed subject matter may further include a volatile memory 820 (e.g., a Random Access Memory (RAM)). The information processing system 800 according to the disclosed subject matter may further include a non-volatile memory 830 (e.g., a hard drive, an optical memory, a NAND or Flash memory). In some embodiments, either the volatile memory 820, the non-volatile memory 830, or a combination or portions thereof may be referred to as a "storage medium". In various embodiments, the volatile memory 820 and/or the non-volatile memory 830 may be configured to store data in a semi-permanent or substantially permanent form.

In various embodiments, the information processing system 800 may include one or more network interfaces 840 configured to allow the information processing system 800 to be part of and communicate via a communications network. Examples of a Wi-Fi protocol may include, but are not limited to, Institute of Electrical and Electronics Engineers (IEEE) 802.11g, IEEE 802.11n. Examples of a cellular protocol may include, but are not limited to: IEEE 802.16m (a.k.a. Wireless-MAN (Metropolitan Area Network) Advanced, Long Term Evolution (LTE) Advanced, Enhanced Data rates for GSM (Global System for Mobile Communications) Evolution (EDGE), Evolved High-Speed Packet Access (HSPA+) Examples of a wired protocol may include, but are not limited to, IEEE 802.3 (a.k.a. Ethernet), Fibre Channel, Power Line communication (e.g., HomePlug, IEEE 1901) It is understood that the above are merely a few illustrative examples to which the disclosed subject matter is not limited.

The information processing system 800 according to the disclosed subject matter may further include a user interface unit 850 (e.g., a display adapter, a haptic interface, a human interface device). In various embodiments, this user interface unit 850 may be configured to either receive input from a user and/or provide output to a user. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

In various embodiments, the information processing system 800 may include one or more other devices or hardware components 860 (e.g., a display or monitor, a keyboard, a mouse, a camera, a fingerprint reader, a video processor). It is understood that the above are merely a few illustrative examples to which the disclosed subject matter is not limited.

The information processing system 800 according to the disclosed subject matter may further include one or more system buses 805. In such an embodiment, the system bus 805 may be configured to communicatively couple the processor 810, the volatile memory 820, the non-volatile memory 830, the network interface 840, the user interface unit 850, and one or more hardware components 860. Data processed by the processor 810 or data inputted from outside of the non-volatile memory 830 may be stored in either the non-volatile memory 830 or the volatile memory 820.

In various embodiments, the information processing system 800 may include or execute one or more software components 870. In some embodiments, the software components 870 may include an operating system (OS) and/or an application. In some embodiments, the OS may be configured to provide one or more services to an application and manage or act as an intermediary between the application and the various hardware components (e.g., the processor 810, a network interface 840) of the information processing system 800. In such an embodiment, the information processing system 800 may include one or more native applications, which may be installed locally (e.g., within the non-volatile memory 830) and configured to be executed directly by the processor 810 and directly interact with the OS. In such an embodiment, the native applications may include pre-compiled machine executable code. In some embodiments, the native applications may include a script interpreter (e.g., C shell (csh), AppleScript, AutoHotkey) or a virtual execution machine (VM) (e.g., the Java Virtual Machine, the Microsoft Common Language Runtime) that are configured to translate source or object code into executable code which is then executed by the processor 810.

The semiconductor devices described above may be encapsulated using various packaging techniques. For example, semiconductor devices constructed according to principles of the disclosed subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, a wafer-level processed stack package (WSP) technique, or other technique as will be known to those skilled in the art.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

In various embodiments, a computer readable medium may include instructions that, when executed, cause a device to perform at least a portion of the method steps. In some embodiments, the computer readable medium may be included in a magnetic medium, optical medium, other medium, or a combination thereof (e.g., CD-ROM, hard drive, a read-only memory, a flash drive). In such an embodiment, the computer readable medium may be a tangibly and non-transitorily embodied article of manufacture.

While the principles of the disclosed subject matter have been described with reference to example embodiments, it will be apparent to those skilled in the art that various changes and modifications may be made thereto without departing from the spirit and scope of these disclosed concepts. Therefore, it should be understood that the above embodiments are not limiting, but are illustrative only. Thus, the scope of the disclosed concepts are to be determined by the broadest permissible interpretation of the following claims and their equivalents, and should not be restricted or limited by the foregoing description. It is, therefore, to be understood that the appended claims are intended to cover all such modifications and changes as fall within the scope of the embodiments.

What is claimed is:

1. A method comprising:
   receiving a circuit model that includes logic circuits that are represented by respective cells, wherein a plurality of cells are arranged in at least one ordered scan chain;
   inserting, into the circuit model, a dummy end cell at an end of the at least one ordered scan chain, such that a previously end cell of the ordered scan chain becomes an intermediate cell of the ordered scan chain and is made available for reordering;
   reordering the at least one ordered scan chain to a reordered scan chain based, at least in part, upon a set of timing constraints, wherein reordering comprises keeping the dummy end cell of the ordered scan chain as the end cell of the reordered scan chain; and
   generating a physical circuit model that includes the reordered scan chain.

2. The method of claim 1, wherein the dummy cell includes a buffer.

3. The method of claim 1, wherein reordering comprises:
   keeping a start cell of the ordered scan chain as a reordered start cell of the reordered scan chain; and
   altering an order or at least one of an intermediate cell within an intermediate portion of the ordered scan chain.

4. The method of claim 1, further comprising:
   after reordering the scan chain, removing the dummy cell from an end of the reordered scan chain.

5. The method of claim 1, wherein reordering comprises: moving a cell from the ordered scan chain to another ordered scan chain.

6. The method of claim 1, wherein reordering comprises: replacing a plurality of scan cells with at least one multi-bit scan cell, wherein the multi-bit scan cell includes as many bits as the plurality of scan cells.

7. The method of claim 6, wherein reordering comprises: replacing a first multi-bit scan cell and at least one single-bit scan cell with a second multi-bit scan cell, wherein the second multi-bit scan cell includes as many bits as the first multi-bit scan cell and the at least one single-bit scan cell.

8. The method of claim 6, wherein reordering comprises:
   replacing a first cell in the scan chain that includes a first set of physical dimensions and performs, when active, a logic function, with a second cell that includes a second set of physical dimensions and performs, when active, the logic function.

9. A computer program product for adjusting a timing of a digital circuit, the computer program product being tangibly embodied on a non-transitory computer-readable medium and including executable code that, when executed, is configured to cause a data processing apparatus to:
   receive a circuit model that includes logic circuits that are represented by respective cells, wherein a plurality of cells are arranged in at least one ordered one scan chain;
   insert, into the circuit model, a dummy cell at an end of the at least one ordered scan chain, such that a previously end of the ordered scan chain is currently an intermediate cell within the ordered scan chain and is made available for reordering; and
   reorder the at least one ordered scan chain to a reordered scan chain based, at least in part, upon a set of design rule constraints, wherein reordering comprises keeping the dummy end cell of the ordered scan chain as the end cell of the reordered scan chain.

10. The computer program product of claim 9, wherein the dummy cell includes a buffer.

11. The computer program product of claim 9, wherein the executable code, when executed, is configured to cause a data processing apparatus to:
   keep a start cell of the ordered scan chain as a reordered start cell of the reordered scan chain; and
   alter an order or at least one of an intermediate cell within an intermediate portion of the ordered scan chain.

12. The computer program product of claim 9, wherein the executable code, when executed, is configured to cause a data processing apparatus to:
   after reordering the scan chain, remove the dummy cell from an end of the reordered scan chain.

13. The computer program product of claim 9, wherein the executable code, when executed, is configured to cause a data processing apparatus to:
   move a cell from ordered scan chain to another scan chain.

14. The computer program product of claim 9, wherein the executable code, when executed, is configured to cause a data processing apparatus to:
   replace a plurality of scan cells with at least one multi-bit scan cell, wherein the multi-bit scan cell includes as many bits as the plurality of scan cells.

15. The computer program product of claim 14, wherein the executable code, when executed, is configured to cause a data processing apparatus to:
   replace a first multi-bit scan cell and at least one single-bit scan cell with a second multi-bit scan cell, wherein the second multi-bit scan cell includes as many bits as the first multi-bit scan cell and the at least one single-bit scan cell.

16. The computer program product of claim 9, wherein the executable code, when executed, is configured to cause a data processing apparatus to:
   replace a first cell in the scan chain that includes a first set of physical dimensions and performs, when active, a logic function, with a second cell that includes a second set of physical dimensions and performs, when active, the logic function.

17. An apparatus comprising:
a digital circuit receiver circuit configured to:
   receive a circuit model file that includes logic circuits that are represented by respective cells, wherein a plurality of cells are arranged in an ordered scan chain, and
   insert, into the circuit model file, a dummy end cell at an end of the ordered scan chain, such that a previously end cell of the ordered scan chain becomes an intermediate cell of the ordered scan chain and is made available for reordering; and
a scan chain reorder circuit configured to:
   reorder the ordered scan chain to a reordered scan chain, wherein the scan-chain reorder circuit is configured to maintain a start cell and an end cell of the ordered scan chain as the start cell and the dummy end cell of the reordered scan chain.

18. The apparatus of claim 17, further comprising:
a chain endpoint adjuster circuit configured to remove, from the circuit model file, the dummy cell from an end of the reordered scan chain.

19. The apparatus of claim 17, wherein the scan chain reorder circuit is configured to:
   delete, from the circuit model file, a plurality of portions of text, each portion representing a timing cell in the scan chain;
   inserting, into a scan chain portion of the circuit model file, a portion of text representing a multi-bit scan cell, wherein the multi-bit scan cell includes as many bits and the timing cells represented by the plurality of portions of text.

20. The apparatus of claim 17, wherein the circuit model file includes representations of a first scan chain and a second scan chain; and
wherein the scan chain reorder circuit is configured to:
   edit a portion of the circuit model file such that a first timing cell from the first scan chain is moved to the second scan chain and combined with a second timing cell from the second scan chain to form a multi-bit scan cell within the second scan chain.

* * * * *